(12) United States Patent
Abughazaleh (10) Patent No.: US 9,941,852 B1
(45) Date of Patent: Apr. 10, 2018

(54) OPERATION AMPLIFIERS WITH OFFSET CANCELLATION

(71) Applicant: FREESCALE SEMICONDUCTOR, INC., Austin, TX (US)

(72) Inventor: Firas N. Abughazaleh, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/278,934

(22) Filed: Sep. 28, 2016

(51) Int. Cl.
*H03F 3/45* (2006.01)
*H03G 1/00* (2006.01)

(52) U.S. Cl.
CPC ...... *H03G 1/0088* (2013.01); *H03F 3/45192* (2013.01); *H03F 2203/45044* (2013.01); *H03F 2203/45074* (2013.01); *H03F 2203/45288* (2013.01)

(58) Field of Classification Search
CPC .................................................. H03F 3/45192
USPC ....................................... 330/9, 51, 252–261
See application file for complete search history.

(56) References Cited

U.S. PATENT DOCUMENTS

| | | | |
|---|---|---|---|
| 4,297,642 | A | 10/1981 | Baldwin et al. |
| 4,948,992 | A | 8/1990 | Bukowski, Jr. |
| 5,124,663 | A | 6/1992 | McEntarfer et al. |
| 5,410,270 | A | 4/1995 | Rybicki et al. |
| 5,475,337 | A | 12/1995 | Tatsumi |
| 6,275,098 | B1 | 8/2001 | Uehara et al. |
| 2003/0146786 | A1 | 8/2003 | Gulati et al. |
| 2005/0110550 | A1 | 5/2005 | Shi et al. |
| 2010/0164589 | A1* | 7/2010 | Lee ................ H03F 3/45183 327/307 |

OTHER PUBLICATIONS

Chen, T. et al., "A 14-bit 200-MHz Current-Steering DAC with Switching-Sequence Post-Adjustment Calibration", IEEE Journal of Solid-State Circuits, vol. 42, No. 11, Nov. 2007, pp. 2386-2394.
Enz, C. et al., "A CMOS Chopper Amplifier", IEEE Journal of Solid-State Circuits, vol. SC-22, No. 3, Jun. 1987, pp. 335-342.
Li, Y. et al., "A High Resolution and High Accuracy R-2R DAC Based on Ordered Element Matching", 2013 IEEE International Symposium on Circuits and Systems (ISCAS), pp. 1974-1977.
Zeng, T. et al., "New Calibration Technique for Current-Steering DACs", Proceedings of 2010 IEEE International Symposium on Circuits and Systems (ISCAS), pp. 573-576.

(Continued)

*Primary Examiner* — Khanh V Nguyen
*Assistant Examiner* — Khiem Nguyen (57) ABSTRACT

A semiconductor device includes an operational transconductance amplifier (OTA) with a matched pair of transistors including a first transistor and a second transistor, and configuration units that include a first set of switches, a second set of switches, and an input transistor. Gain adjustment circuitry is coupled to adjust gain of the OTA. Measurement circuitry is coupled to measure offset in the OTA. Control logic is configured to operate the first and second sets of switches to couple input transistors of a first group of the configuration units to the first transistor of the matched pair of transistors, and to couple input transistors of a remaining group of the configuration units to the second transistor of the matched pair of transistors. Settings of the first and second sets of switches are selected to minimize the offset.

19 Claims, 8 Drawing Sheets

(56) References Cited

OTHER PUBLICATIONS

Zeng, T. et al., "An Order-Statistics Based Matching Strategy for Circuit Components in Data Converters", IEEE Transactions on Circuits and Systems—I: Regular Papers, vol. 60, No. 1, Jan. 2013, pp. 11-24.

\* cited by examiner

OPERATION AMPLIFIERS WITH OFFSET CANCELLATION

BACKGROUND

Field

This disclosure relates generally to operational amplifiers, and more specifically, to cancelling offset in an operational amplifier.

Related Art

Operational amplifiers (opamps) are commonly used in various different circuits. For example, they may be used to implement comparators, buffers, and analog to digital converters. They typically have a differential input, referred to as non-inverting input (Vinp) and an inverting in input (Vinm), and produce an output, Vout. The opamp amplifies the difference in voltage between the inputs (Vinp−Vinm).

Figure 1:
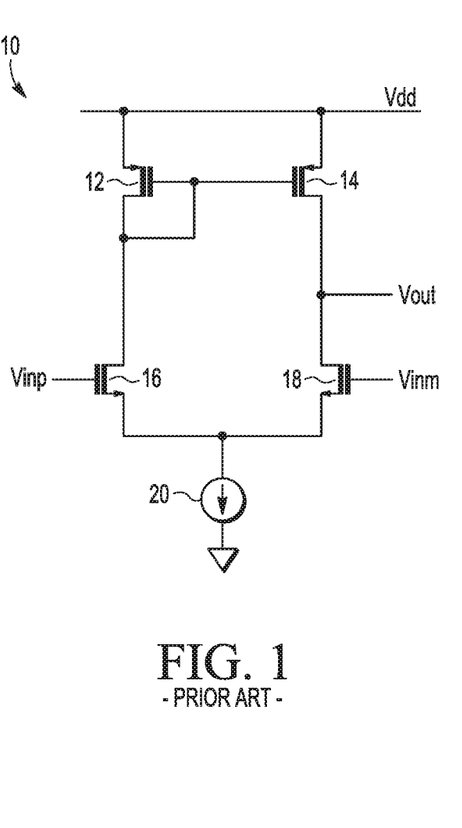
FIG. 1 illustrates a prior art opamp.

Referring to FIG. 1, opamp 10 is a prior art opamp including a first p-channel transistor 12 and a second p-channel transistor 14, a first n-channel transistor 16, a second n-channel transistor 18, and a current source 20. The sources of each of transistors 12 and 14 is coupled to Vdd, the gates of transistors 12 and 14 are coupled to each other and the drain of transistor 12. The drain of transistor 16 is coupled to the drain of transistor 12, and the drain of transistor 18 is coupled to the drain of transistor 14 and provides Vout. The gate of transistor 16 receives Vinp and the gate of transistor 18 receives Vinm. The sources of transistors 16 and 18 are coupled to a first terminal of current source 20 and a second terminal of current source 20 is coupled to ground.

Figure 2:
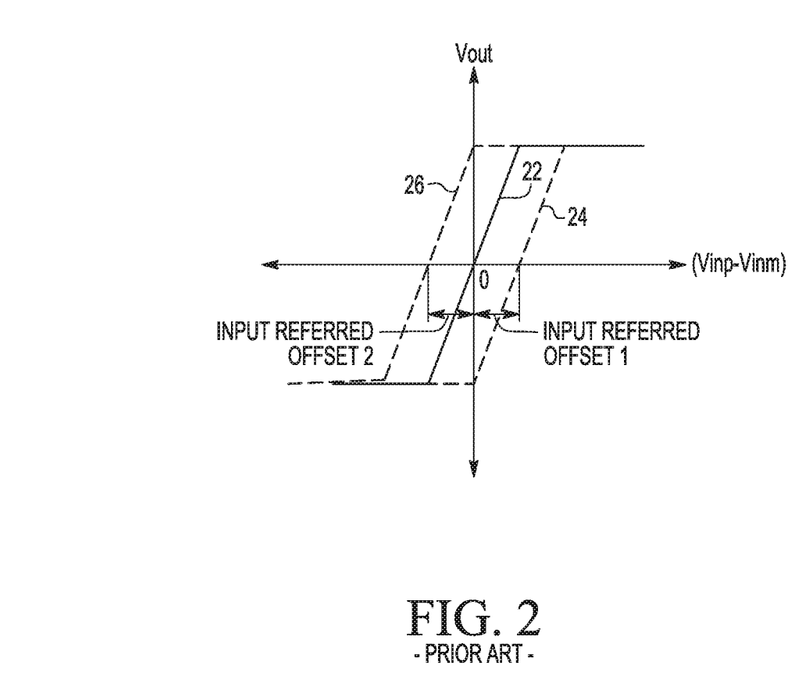
FIG. 2 illustrates output curves associated with the opamp of FIG. 1.

Referring now to FIG. 2, FIG. 2 illustrates voltage curves 22, 24, and 26 for opamp 10 of (Vinp−Vinm) versus Vout. Curve 22 indicates the ideal opamp when all devices are balanced. In this case, when Vinp−Vinm is 0, Vout is 0 as well. However, if transistor 18 is stronger than transistor 16, more current flows down through transistor 18 and when Vinp−Vinm is 0, Vout is negative, resulting in curve 24 which has a positive offset from ideal curve 22. This offset may be referred to as input referred offset 1. Similarly, if transistor 16 is stronger than transistor 18, Vout is positive when Vinp−Vinm is 0, resulting in curve 26 which has a negative offset from ideal curve 22. Note also, that for curves 22, 24, and 26, it is assumed that opamp 10 has a gain of 1. As the gain of opamp 10 is increased, the slope of the curves increases.

Transistors 16 and 18 are typically off balance (i.e. not precisely matched) due to process variations during their manufacture. As described above, this results in an input referred offset which may introduce error into any circuitry using the opamp. Therefore, a need exists for reducing the input referred offset of an opamp.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In an opamp, the differential input can be provided to two transistors, which can be referred to as transistor A and transistor B. For example, the transistors 16 and 18 in opamp 10 of the prior art, may correspond to transistor A and transistor B, respectively. Each of these transistors, though, can be implemented as a group of transistors, such that the opamp includes a transistor group A and a transistor group B. The gates of transistors of group A each receive a first differential input, Vinp, and the gates of transistors of group B each receive a second differential input, Vinm. Even if the transistors of group A are designed to match the transistors of group B, due to process variations, they will typically not be matched and result in an inferred offset balance for the opamp. In one embodiment, each transistor of the groups A and B is implemented as a configuration unit with an input transistor and a set of switches. The set of switches allow each transistor to be configured as being a part of group A or group B. In this manner, a calibration process can be performed to determine a configuration of the transistors in groups A and B that achieves a more balanced opamp and thus reduces the input referred offset. Also, in one embodiment, a gain modifier can be applied to the output of the opamp. The calibration process can further take into account a gain modification by the gain modifier to reduce the input referred offset.

Figure 3:
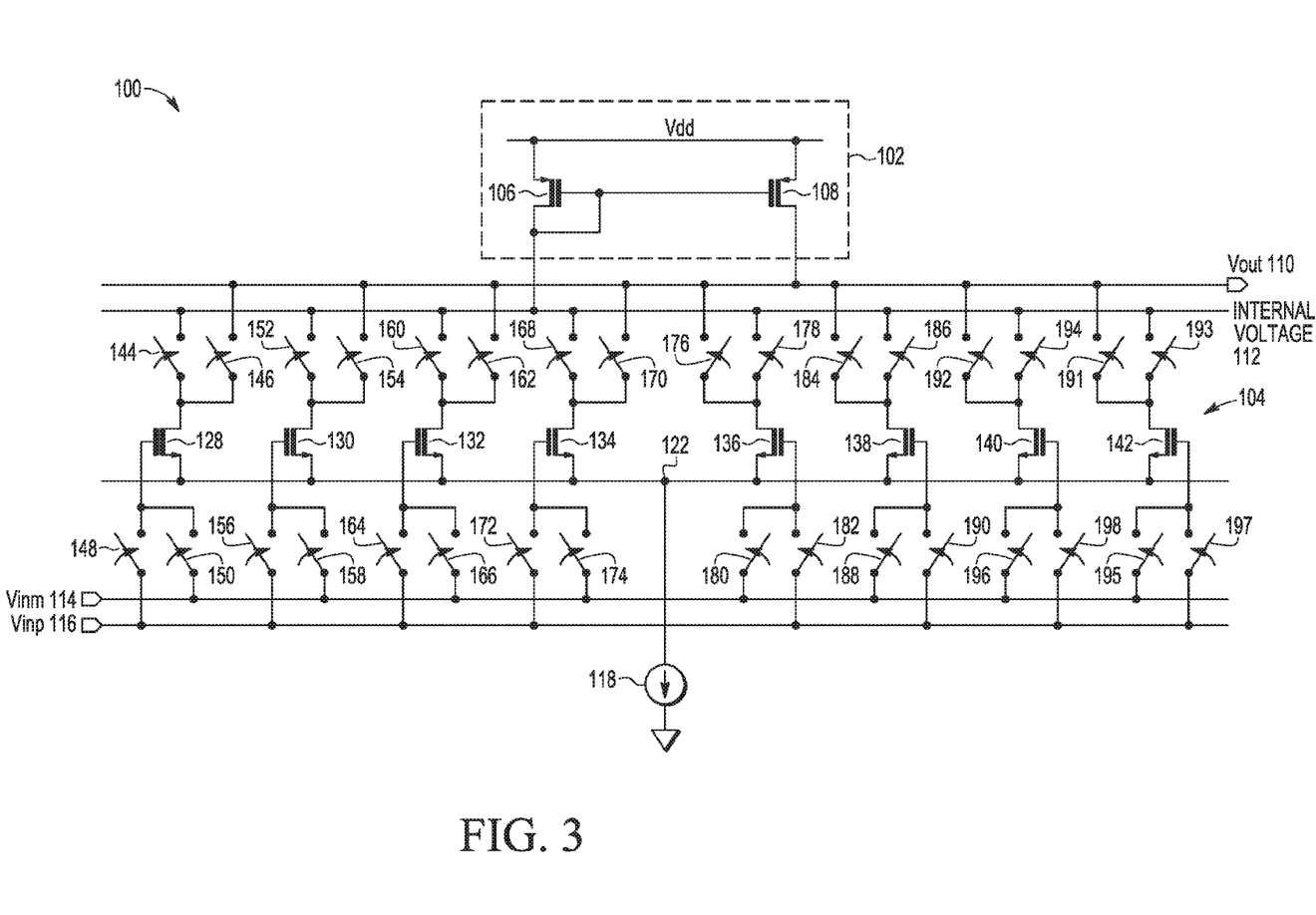
FIG. 3 illustrates, in schematic form, an opamp in accordance with one embodiment of the present invention.

FIG. 3 illustrates, in schematic form, an operation amplifier (opamp) 100 in accordance with one embodiment of the application. In the illustrated embodiment, opamp 100 is an operational transconductance amplifier (OTA), and may therefore be referred to as OTA 100. OTA 100 receives a differential input at a non-inverting input node, Vinp 116, and an inverting input node, Vinm 114, and provides a single ended output at a voltage output node, Vout 110. OTA 100 includes a matched pair of transistors 102. Matched pair includes a p-type transistor 106 and a p-type transistor 108. A source electrode of transistor 106 and a source electrode of transistor 108 is coupled to a first power supply terminal, e.g. Vdd. A gate electrode of transistor 106 is coupled to a drain electrode of transistor 106 and a gate electrode of transistor 108. A drain electrode of transistor 106 is coupled to an internal voltage node, internal voltage 112, and a drain electrode of transistor 108 is coupled to Vout 110. OTA 100 also includes a current source 118 having a first terminal coupled to a circuit node 122 and a second terminal coupled to a second power supply terminal, e.g. ground. As used herein, the drain electrode and the source electrode of each transistor may also be referred to as current electrodes.

OTA 100 includes a plurality of configuration units 104 coupled to Vout 110, internal voltage 112, Vinp 116, Vinm 114, and the second terminal of current source 118. Each configuration unit includes an n-type input transistor and a corresponding set of switches. For example, a first configuration unit includes an input transistor 128, a first set of switches 144 and 148, and a second set of switches 146 and 150. A second configuration unit includes an input transistor 130, a first set of switches 152 and 156, and a second set of switches 154 and 158. A third configuration unit includes an input transistor 132, a first set of switches 160 and 164, and a second set of switches 162 and 166. A fourth configuration unit includes an input transistor 134, a first set of switches 168 and 172, and a second set of switches 170 and 174. A fifth configuration unit includes an input transistor 136, a first set of switches 176 and 180, and a second set of switches 178 and 183. A sixth configuration unit includes an input transistor 138, a first set of switches 184 and 188, and a second set of switches 186 and 190. A seventh configuration unit includes an input transistor 140, a first set of switches 192 and 196, and a second set of switches 194 and 198. An eighth configuration unit includes an input transistor 142, a first set of switches 191 and 195, and a second set of switches 193 and 197.

In each configuration unit, a first switch of the first set of switches (e.g. switch 144 in the first configuration unit) has a first terminal coupled to internal voltage 112, a second terminal coupled to the drain electrode of the input transistor (e.g. transistor 128), and a control terminal coupled to receive a first control signal. A second switch of the first set of switches (e.g. switch 148 in the first configuration unit) has a first terminal coupled to the gate electrode of the input transistor (e.g. transistor 128), a second terminal coupled to Vinp 116, and a control terminal coupled to receive the first control signal. A first switch in the second set of switches (e.g. switch 146 in the first configuration) has a first terminal coupled to Vout 110, a second terminal coupled to the drain of the input transistor (e.g. transistor 128), and a control terminal coupled to receive a second control signal. A second switch in the second set of switches (e.g. switch 150 in the first configuration) has a first terminal coupled to the gate electrode of the input transistor (e.g. transistor 128), a second terminal coupled to Vinm 114, and a control terminal coupled to receive the second control signal. A source electrode of the input transistor (e.g. transistor 128) is coupled to node 122. Each of the configuration units has an analogous configuration. In each configuration unit, the first control signal is the inverse of the second control signal, such that the closing and opening of first set of switches and the second set of switches, respectively, is mutually exclusive. As used herein, a switch that is closed or on indicates that the switch is in the conductive state between the first and second terminal, and a switch that is open or off indicates that the switch is in the non-conductive state between the first and second terminal.

In operation, the first set of switches in a configuration unit, when on, couples the drain electrode of the input transistor to internal voltage 112, which corresponds to the drain electrode of transistor 106, and couples the gate electrode of the input transistor to Vinp 116. When the first set of switches is on, the second set of switches in the configuration unit is off, which decouples the drain electrode of the input transistor from Vout 110, which corresponds to the drain electrode of transistor 108, and decouples the gate electrode of the input transistor from Vinm 114. However, when the second set of switches in the configuration unit is on, the drain electrode of the input transistor is coupled to the drain electrode of transistor 108 and the gate electrode of the input transistor is coupled Vinm 114. When the second set of switches is on, the first set of switches in the configuration unit is off, which decouples the drain electrode of the input transistor from the drain electrode of transistor 106 and decouples the gate electrode of the input transistor from Vinp 116. In this manner, depending on the settings of the first and second control signals of each configuration unit, the input transistor in each configuration unit can be coupled as a group A transistor (in which its drain electrode is coupled to the drain of transistor 106 and its gate electrode is coupled to Vinp 116) or as a group B transistor (in which its drain electrode is coupled to the drain of transistor 108 and its gate electrode is coupled to Vinm 114).

The first control signals of the configuration units corresponding to group A can be the same control signal and the second control signals of the configuration units corresponding to group A can be the same control signal. Likewise, the first control signals of the configuration units corresponding to group B can be the same control signal and the second control signals of the configuration units corresponding to group B can be the same control signal. The first and second control signals for group A and the first and second control signals for group B are the inverse of each other. Therefore, in one embodiment, a control signal is provided to group A as the first control signal and to group B as the second control signal, and an inverse of the control signal is provided to group A as the second control signal and to group B as the first control signal. Note that the first and second control signals can be provided, as needed, by control circuitry, such as state machine circuitry, to provide the appropriate values to configure each input transistor as a group A or group B transistor. Also, in one embodiment, each of group A and group B is configured so as to have an equal number of transistors.

Typically in an opamp, the transistors in each of groups A and B are fixed at the time the circuit is manufactured. However, due to process variations, the transistors may not result in the desired balance between groups A and B. Furthermore, process variations may also result in a misbalance of matched pair 102. Therefore, in one embodiment, as will be described below, configuration units 104 allow for the transistors for each group to be selected, such as by an on-chip offset calibration unit, after manufacture. In the case of needing group A and B to be balanced, the groups can be decided after manufacture such that the closest balance can be achieved for an opamp, such as OTA 100.

Figure 4:
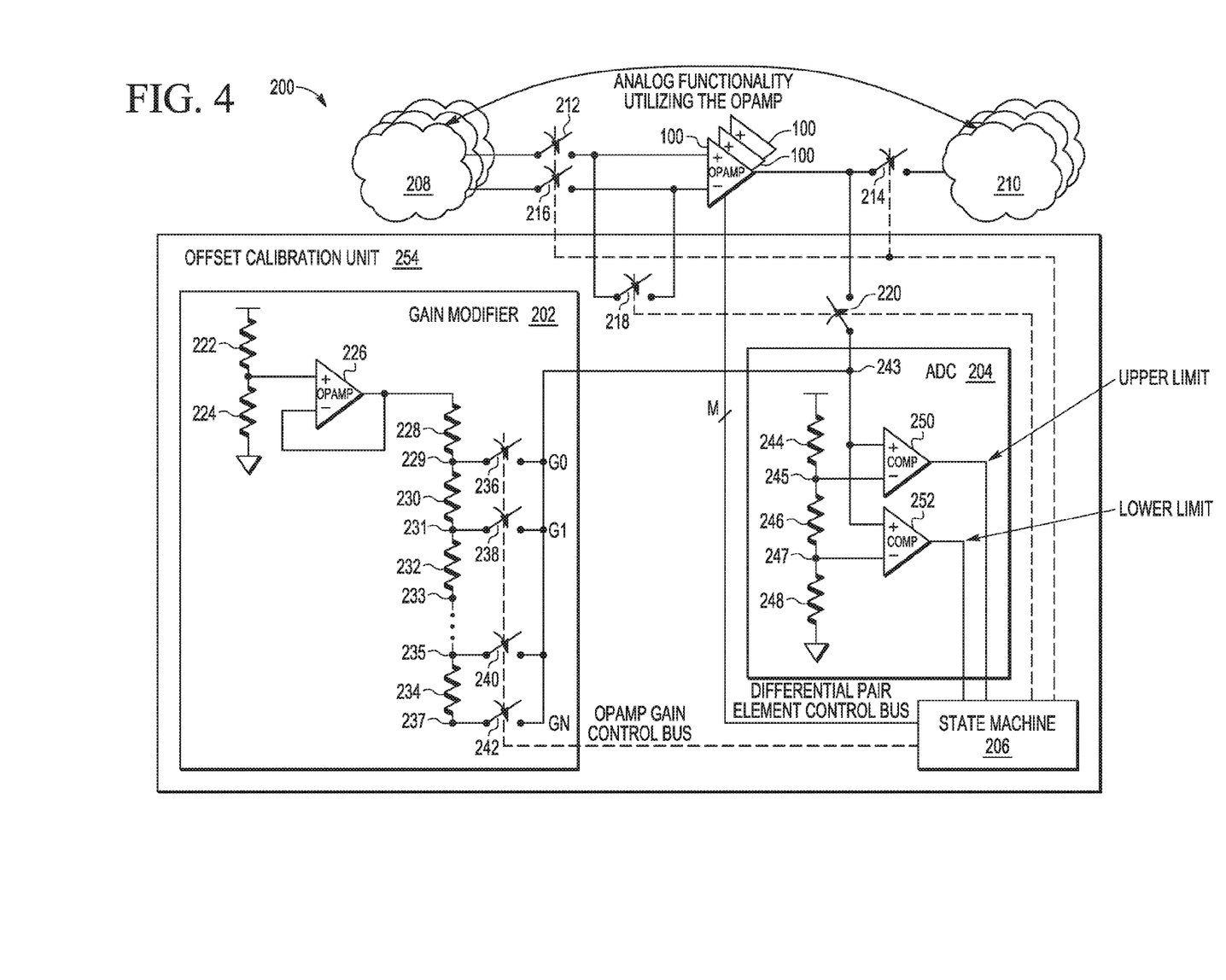
FIG. 4 illustrates, in partial schematic and partial block diagram form, an opamp system having an opamp as in FIG. 3 and an offset calibration unit, in accordance with one embodiment of the present invention.

FIG. 4 illustrates, in partial schematic and partial block diagram form, an opamp system 200 including OTA 100 and an offset calibration unit 254, in accordance with one embodiment of the present invention. System 200 includes any number of opamps 100, in which each opamp can be like OTA 100. Each opamp is coupled to input circuitry 208 which provides inputs to the opamps and output circuitry 210 which further processes the opamp outputs. The opamps can be used in a variety of applications to implement a variety of functions, therefore, circuitry 208 and 210 can include any type of circuitry which requires the use of one or more opamps. System 200 also includes switches 212, 216, and 214. Switch 212 couples or decouples circuitry 208 to or from the non-inverting inputs to the opamps. Switch 216 couples or decouples circuitry 208 to or from the inverting inputs of the opamps. Switch 214 couples or decouples the output of the opamps to or from circuitry 210.

System 200 also includes an offset calibration unit 254 coupled to the inputs and outputs of the opamps, and coupled to provide the control signals for the configuration units in each opamp. Offset calibration unit 254 includes switches 218 and 220, a gain modifier 202, and analog to digital converter (ADC) 204, and state machine circuitry 206. Switch 218 couples or decouples the non-inverting and inverting inputs to or from each other. Switch 220 couples or decouples the outputs of the opamps to or from a circuit node 243.

Gain modifier 202 includes resistors 222, 224, 228, 230, 232, and 234, opamp 226, and switches 236, 238, 240, 242. A first terminal of resistor 222 is coupled to the first supply voltage terminal, e.g. Vdd, and a second terminal of resistor 222 is coupled to a voltage common mode node (VCM). A first terminal of resistor 224 is coupled to VCM, and a second terminal of resistor 224 is coupled to the second voltage supply terminal, e.g. ground. A non-inverting input of opamp 226 is coupled to VCM and an inverting input of opamp 226 is coupled to an output of opamp 226. The output of opamp 226 is coupled to a first terminal of resistor 228, and a second terminal of resistor 228 is coupled to a circuit node 229. A first terminal of resistor 230 is coupled to node 229 and a second terminal to a circuit node 231. A first terminal of resistor 232 is coupled to node 231 and a second terminal to a circuit node 233. A first terminal of resistor 234 is coupled to a circuit node 235 and a second terminal to a circuit node 237. There can be any number, 0 or more, of resistors coupled in series between nodes 233 and 235. Switch 236 couples or decouples node 229 to or from node 243. When on, switch 236 results in a gain of G0. Switch 238 couples or decouples node 231 to or from node 243. When on, switch 238 results in a gain of G1. Switch 240 couples or decouples node 235 to or from node 243. When on, switch 240 results in a gain of G(N−1). Switch 242 couples or decouples node 237 to or from node 243. When on, switch 242 results in a gain of GN. Therefore, by closing switch 220 and a select one of switches 236, 238, 240, and 242, the gain of opamps 100 can be modified to be G0 to GN. When all switches between the output of opamp 226 and node 243 are open, opamp 100 is at its intrinsic gain, Gi. Note that G0 is the lowest gain and increases to GN and to Gi, with Gi being the highest gain. In alternate embodiment, different circuitry may be used to modify the gain of opamp 100.

ADC 204 includes comparators 250 and 252 and resistors 244, 246, and 248. A noninverting input of comparator 250 is coupled to node 243 and an inverting input of comparator 250 is coupled to a circuit node 245. An output of comparator 250 is coupled to provide a first comparison result (corresponding to an upper limit) to state machine circuitry 206. A noninverting input of comparator 252 is coupled to node 243 and an inverting input of comparator 252 is coupled to a circuit node 247. An output of comparator 252 is coupled to provide a second comparison result (corresponding to a lower limit) to state machine circuitry 206. Therefore, the outputs of comparators 250 and 253 provide information as to whether the voltage at Vout 110 of opamp 100 is within a range defined by the lower and upper limits. A first terminal of resistor 244 is coupled to the first supply voltage terminal, e.g. Vdd, and a second terminal of resistor 244 is coupled to node 245. A first terminal of resistor 246 is coupled to node 245 and a second terminal to node 247. A first terminal of resistor 248 is coupled to node 247 and a second terminal to the second supply voltage terminal, e.g. ground. Note that different circuitry may be used rather than ADC 204 to determine if the output voltage is within the acceptable limits. State machine circuitry 206 provides control signals to switches 212, 216, 218, 214, 220, 236, 238, 240, and 242, and provides control signals to opamps 100. Note that the circuitry of offset calibration unit 254 can be applied in turn to each opamp 100 in system 200 to calibrate each opamp. The calibration of each opamp results in selecting the transistors of the opamp for group A and for group B for that opamp. Operation of ADC 204, including state machine 206, and gain modifier 202 will be further described in reference to FIGS. 5-7 below.

Figure 5:
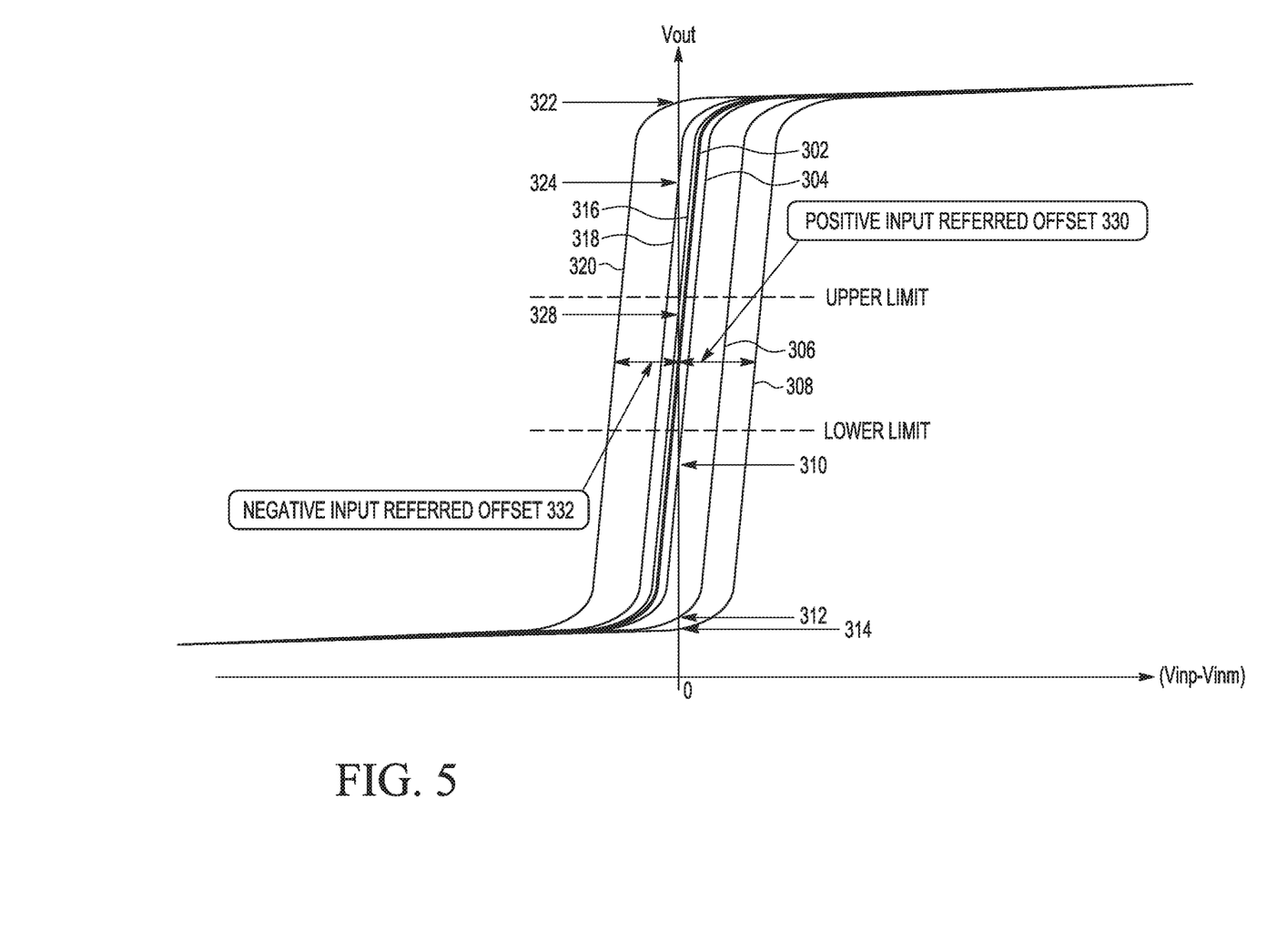
FIG. 5 illustrates various output curves for the opamp of FIG. 3, in accordance with various examples of the present invention.

In the case of 4 transistors in each of group A and group B, as illustrated in the example of opamp 100 of FIG. 3, there are $2^4$ possible combinations (for a total of 16 combinations) of transistor grouping. Each of these combinations results in a different output curve for the opamp. FIG. 5 illustrates various output curves for opamp 100, in accordance with various different combinations of transistors. As described above, when Vinp−Vinm is 0, the output voltage of a balanced opamp is 0. Therefore, when Vinp is shorted to Vinm (such as by switch 218 in FIG. 4), the ideal output curve is represented as curve 302 (the bolded curve). However, when opamp 100 is not balanced, such that one of group A or B is stronger, there is a negative offset or a positive offset, respectively. FIG. 5 illustrates various curves 304, 306, and 308 for which the combination of transistors in groups A and B resulted in group B being stronger and pulling more current than group A. Curve 308 is the curve with the greatest positive input referred offset 330. For curves 316, 318, and 320, the combination of transistors in groups A and B resulted in group A being stronger and therefore, have a negative offset, with the most negative input referred offset being negative offset 332.

Upper and lower limits are provided to determine if an output curve has a sufficiently small offset to be acceptable. The upper limit corresponds to the highest value Vout can have when Vinp is shorted to Vinm, i.e. when Vinp−Vinm=0. The lower limit corresponds to the lowest value Vout can have when Vinp is shorted to Vinm. In the illustrated embodiment, curve 316 is acceptable because it crosses the Vinp−Vinm=0 axis at a voltage (at point 328) which is less than the upper limit. However, curves 318 and 320 are unacceptable because they cross the Vinp−Vinm=0 axis at voltages (points 324 and 322, respectively) that are greater than the upper limit. Likewise, each of curves 304, 306, and 308 are unacceptable because the cross the Vinp−Vinm=0 axis at voltages (points 310, 312, and 314, respectively, that are less than the lower limit. Therefore, in the illustrated example of FIG. 5, only a combination of group A and group B transistors which results in curve 316 is acceptable for that opamp. Alternatively, any combination of group A and B transistors which results in a curve that crosses the Vinp−Vinm=0 axis between the upper and lower limits would likewise be acceptable.

Figure 6:
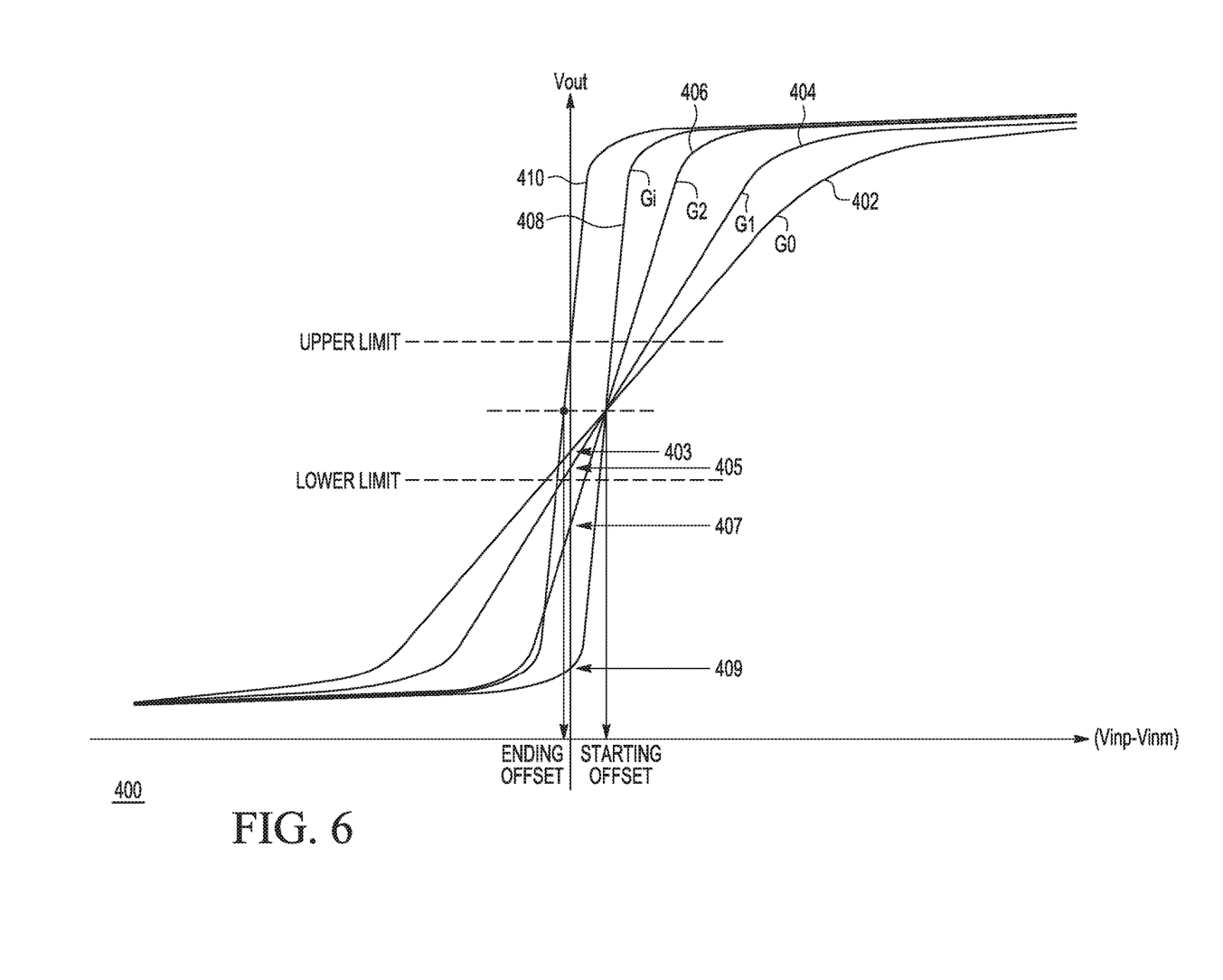
FIG. 6 illustrates various output curves corresponding to different gain values in accordance with various examples of the present invention.

FIG. 6 illustrates various output curves for opamp 100 corresponding to different gain values, which can be provided, for example, by gain modifier 202 of FIG. 4. In the illustrated embodiment, each of curves 408, 406, 404, and 402 correspond to a configuration of group A and group B transistors of opamp 100 resulting in a particular positive input referred offset, indicated as "starting offset" in FIG. 6. In the illustrated embodiment, curve 408 corresponds to opamp 100 having its intrinsic gain value, Gi, at the starting offset. This intrinsic gain corresponds, for example, to all of switches 236, 238, 240, and 242 being open in FIG. 4 such that opamp 226 is decoupled from the output of opamp 100. This curve at the starting offset with a gain of Gi is unacceptable because the 0 crossing occurs below the lower limit (at point 409). As the gain is decreased, the slope of the output curve also decreases. Therefore, curve 406 corresponds to a gain of G2 which is less than Gi and has a lower slope. This brings up the 0 crossing to point 407, which is still unacceptable because it is below the lower limit. However, curve 404 corresponding to a gain of G1 which is less than G2 and curve 402 with a gain of G0 which is less than G1, decrease the slope sufficiently such that the 0 crossings (at points 405 and 403, respectively) are above the lower limit. While both curves are acceptable, the one with the highest gain is selected, which would be curve 404 rather than 402, in this example.

Curve 410 corresponds to a different configuration of transistors in groups A and B which result in a small negative input referred offset. Curve 410 also corresponds to a configuration which has an intrinsic gain. Note that curve 410, as with curves 404 and 402, is also acceptable because it falls within the limits. The configuration that is chosen in the end is the one that yields an opamp output with the smallest input referred offset that falls within the limits at or near the highest gain setting. Therefore, curve 410 would be preferable over curves 404 or 402.

Referring to FIG. 4, the comparison of the upper and lower limits at the Vinp−Vinm=0 axis can be performed by opening switches 212, 216 and 214, and closing switches 218 and 220. The resistors 244, 246, and 248 are selected to provide the appropriate upper and lower limits for comparison purpose. The output of comparator 250 and the output of comparator 252 can then be interpreted by state machine 206 to determine if Vout surpasses the upper limit, is below the lower limit, or is within the upper and lower limits. In response to the outputs of comparators 250 and 252, state machine 206 controls switches 236, 238, 240, and 242. By controlling these switches, gain modifier 202 can adjust the gain of opamp 100. Therefore, as will be described in reference to FIG. 7 below, gain modifier and ADC 204 are used to determine the best configuration of group A and group B transistors, such as the configuration that results in the smallest input referred offset that falls within the upper and lower limits and is at the highest gain possible.

Figure 7:
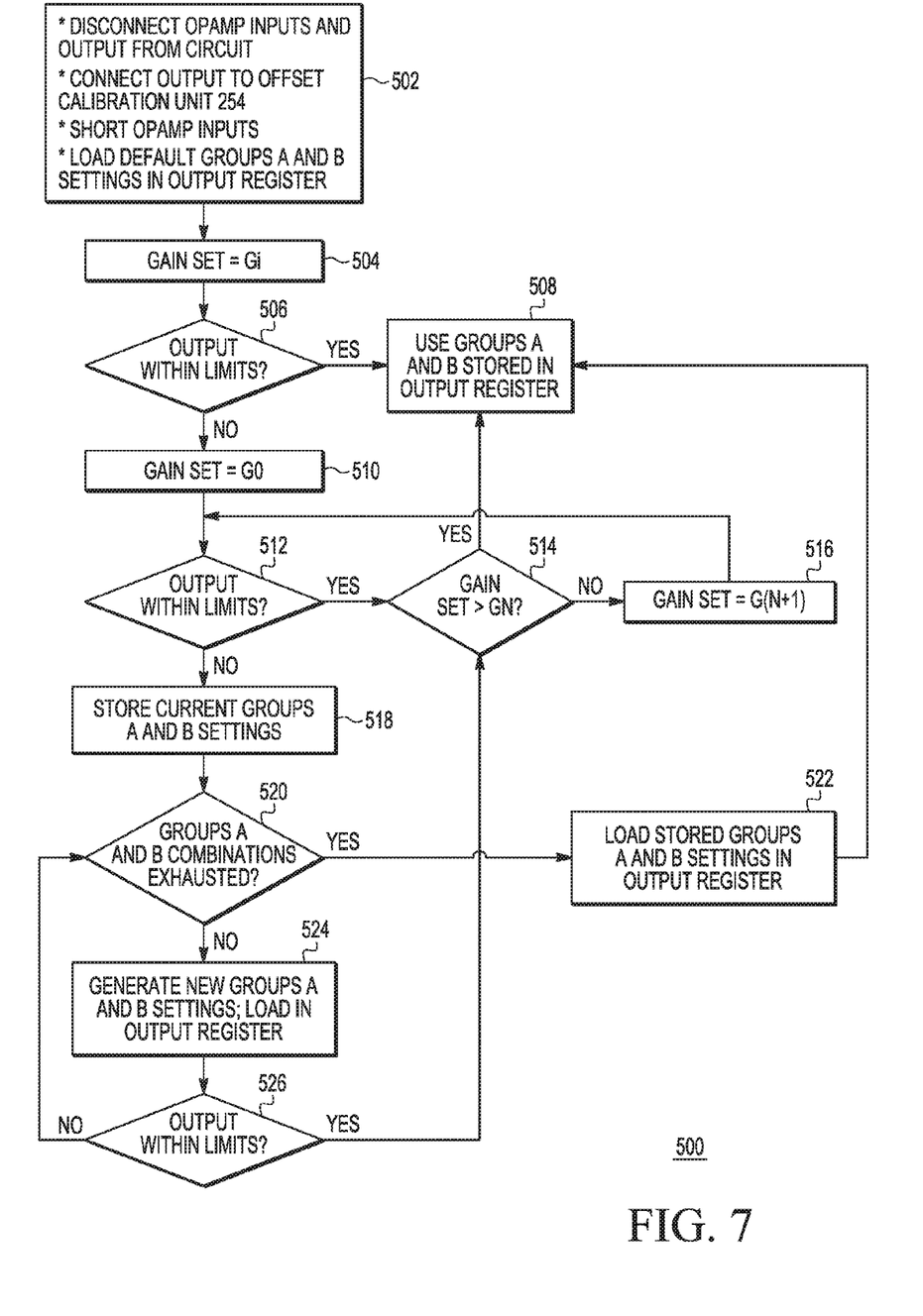
FIG. 7 illustrates, in flow diagram form, operation of the opamp system of FIG. 4, in accordance with one embodiment of the present invention.

FIG. 7 illustrates a method 500 of operation of opamp system 200, in accordance with one embodiment of the present invention. Method 500 begins with block 502, in which a calibration mode for opamp 100 begins. The opamp inputs and outputs are disconnected from the remainder of their respective circuitry. This corresponds to opening switches 212, 216, and 214, which decouples opamps 100 from circuitry 208 and 210. Also, the opamp output is coupled to offset calibration unit 254, such as by closing switch 220. The opamp inputs are shorted to each other, such as by closing switch 218. The default (i.e. initial) groups A and B settings are loaded in an output register (this may be located in state machine circuitry 206). The default groups A and B setting correspond to the indication of which transistors belong to group A and which belong to group B, and the first and second set of switches in each configuration unit of configuration units 104 are set accordingly. In one embodiment, the default configuration corresponds to input transistors 128, 130, 132, and 134 belonging to group A and thus have their drains coupled to the drain of transistor 106 and gates to Vinp 116 and input transistors 136, 138, 140, and 142 belonging to group B and thus have their drains coupled to the drain of transistor 108 and gates to Vinm 114. The first and second set of switches of each corresponding configuration unit is set accordingly, as was described above in reference to FIG. 3. Note that for each configuration change in method 500, any switches can be controlled by state machine circuitry 206.

Method 500 proceeds to block 504 in which the initial gain is set to the intrinsic gain, Gi. This corresponds to having all switches between the output of gain modifier 202 and node 243 open. That is, it corresponds to decoupling gain modifier 202 from the output of opamp 100. After setting the gain to Gi, method 500 proceeds to decision diamond 506 in which it is determined if the output (e.g. Vout 110 of opamp 100) is within the upper and lower limits. If it is, then the current groups A and B setting which is stored in the output register is used and calibration mode is done. At this point, switches 212, 216, and 214 can again be closed, and switches 218 and 220 be opened. If, at decision diamond 506, the output was not within the upper and lower limits, method 500 proceeds to block 510, where the gain is decreased to G0. As illustrated in FIG. 4, this corresponds to closing switch 236.

Method 500 then proceeds to decision diamond 512 where it is again determined if the output (e.g. Vout 110) is within the upper and lower limits. If not, method 500 proceeds to block 518 where the current groups A and B settings are stored. Method 500 proceeds to decision diamond 520 in which it is determined if all the group A and B combinations have been exhausted. In the case of each group having 4 transistors, there are 16 possible combinations. If not all combinations have been exhausted, the method proceeds to block 524 in which a new groups A and B setting is generated representative of another of the possible transistor combinations. These settings for the new combination are then saved in the output register. In one embodiment, the settings for the new combination overwrites the previous settings in the output register.

After block 524, method 500 proceeds to decision diamond 526 in which it is again determined if the output (e.g. Vout 110) is within the upper and lower limits. If so, or if at decision diamonds 506 or 512 the output was within the upper and lower limits, method 500 proceeds to block 514 where it is determined if the gain is greater the GN. If so, then the max gain has been reached, and the method proceeds to block 508 in which the groups A and B settings stored in the output register is used for the opamp. If at decision diamond 514, the maximum gain has not been reached, method 500 proceeds to block 516 where the gain is increased to G(N+1). Therefore, the gain is stepped up in turn from Gi to G0 to G1 to G2, etc. until the appropriate settings are determined. After block 516, method 500 returns to decision diamond 512.

Referring back to decision diamond 520, if all the groups A and B transistor combinations have been exhausted, the method proceeds to block 522 in which current groups A and B settings are loaded into the output register. The method then proceeds to block 508 where these settings are used for the opamp.

Figure 8:
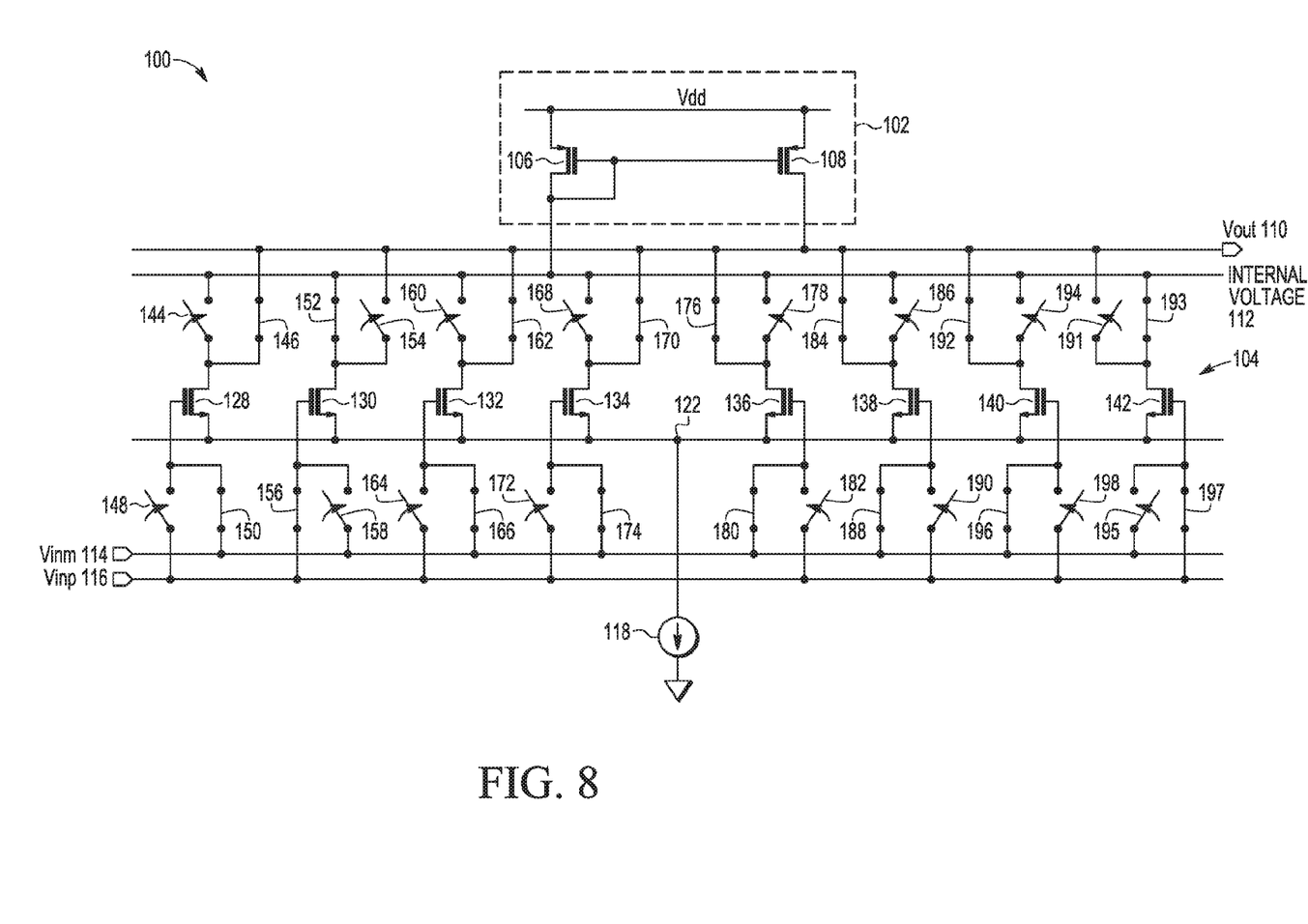
FIG. 8 illustrates, in schematic form, an opamp in accordance with one embodiment of the present invention.

FIG. 8 illustrates, in schematic form, OTA 100 configured according to the calibration method of FIG. 7, in accordance with one example of the present invention. In the example of FIG. 7, transistors 130, 136, 138, and 140 are configured as group A transistors and transistors 128, 132, 134, and 142 are configured as group B transistors. This configuration is achieved by closing switches 146, 150, 152, 156, 162, 166, 170, 174, 176, 180, 184, 188, 192, 196, 193, and 197, and opening the remaining switches of the configuration units. With this configuration, an acceptable balance of group A and group B transistors is achieved.

Figure 9:
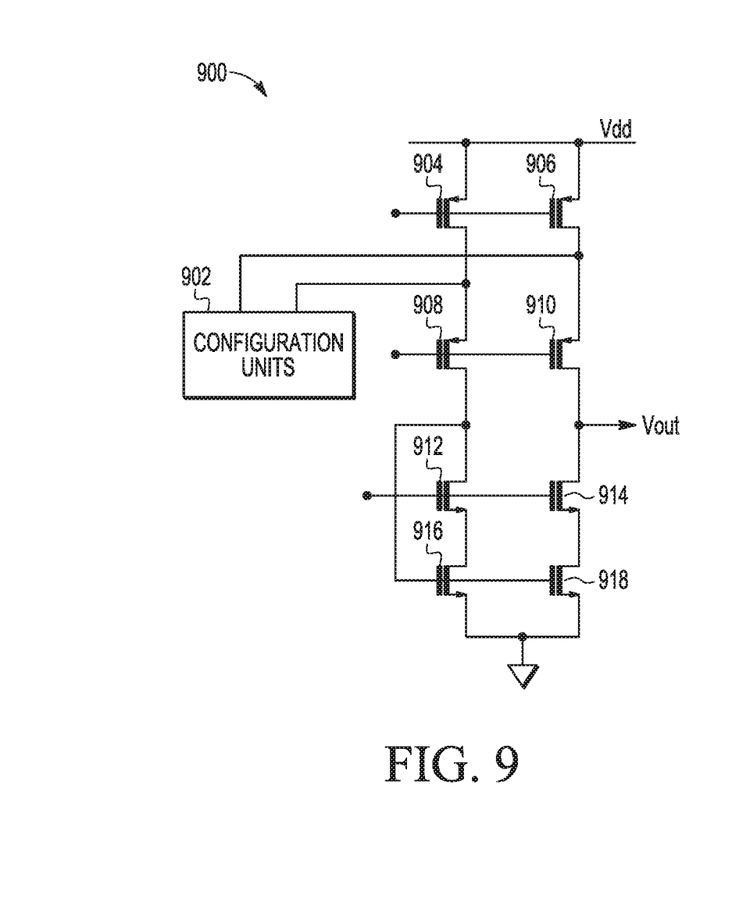
FIGS. 9 and 10 illustrate, in partial schematic and partial block diagram form, an opamp in accordance with an alternate embodiments of the present invention.
Figure 10:
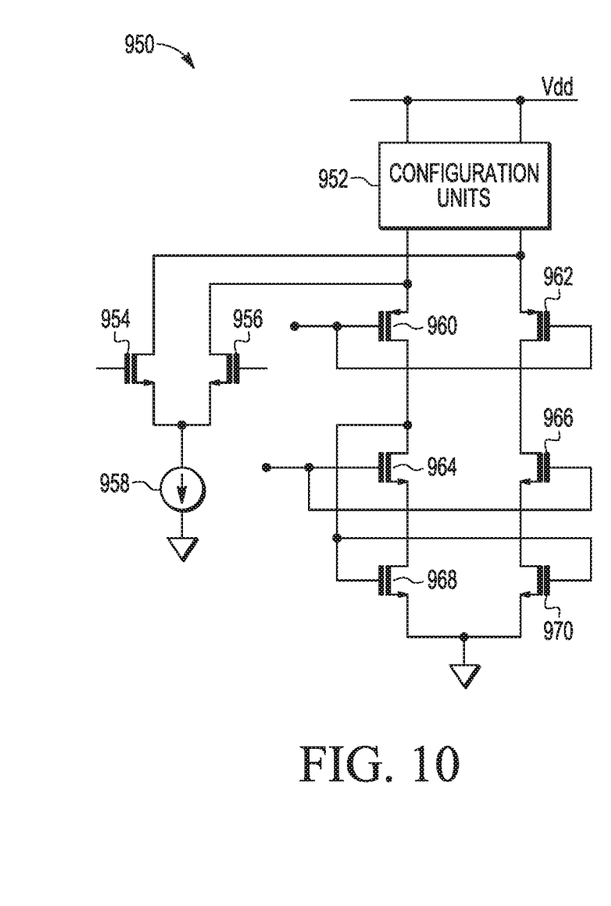

FIGS. 9 and 10 illustrate, in partial schematic and partial block diagram form, opamps 900 and 950, respectively, in accordance with alternate embodiments of the present invention. Each of these embodiments include different circuitry than the matched pair of transistors in FIG. 3 and may be referred to as "folded cascade" amplifier topology. Referring to opamp 900 of FIG. 9, opamp 900 includes p-type transistors 904, 906, 908, and 910, and n-type transistors 912, 914, 916, and 918, and configuration units 902. A source electrode of transistors 904 and 906 is coupled to a first power supply terminal, e.g. Vdd. A source electrode of transistor 908 is coupled to a drain electrode of transistor 904 and configuration units 902. A source electrode of transistor 910 is coupled to a drain electrode of transistor 906 and configuration units 902. A gate electrodes of transistors 904 and 906 is coupled to receive a first bias voltage. A gate electrode of transistors 908 and 910 is coupled to receive a second bias voltage. A drain electrode of transistor 912 is coupled to a drain electrode of transistor 908 and gate electrodes of transistors 916 and 918. A drain electrode of transistors 916 is coupled to a source electrode of transistor 912, and a source electrode of transistor 916 is coupled to a second supply voltage, e.g., ground. A drain electrode of transistors 914 is coupled to a drain electrode of transistor 910 and an output node which provides the output voltage, Vout. A drain electrode of transistor 918 is coupled to a source electrode of transistor 914, and a source electrode of transistor 918 is coupled to the second power supply. A gate electrode of transistors 912 and 914 is coupled to receive a third bias voltage. Configuration units 902 is similar to configuration units 104. The configuration units include switches to the gate electrodes of the input transistors and to the drain electrodes of the input transistors, like in configuration units 104, but a common source is shared for the source electrodes of the input transistors. As another opamp and configurability embodiment, configuration units 902 are similar in structure and function as configuration units 104, and transistors 904, 906, 908, 910, 912, 914, 916, and 918, in aggregate, provide functionality similar to matched pair 102. Method 500 continues to apply and serve the same purpose by manipulating the configuration units and the gain to find the optimal arrangement of group A and group B for producing the least opamp offset.

Referring to opamp 950 of FIG. 10, opamp 950 includes p-type transistors 960 and 962, n-type transistors 954, 956, 964, 966, 968, and 970, and configuration units 952. Configuration units 952 is coupled to a first power supply terminal, e.g., Vdd. A source electrode of transistor 960 is coupled to configuration units 952 and to a drain electrode of transistor 956. A source electrode of transistor 962 is coupled to configuration units 952 and a drain electrode of transistor 954. Source electrodes of transistors 954 and 956 are coupled to a first terminal of a current source 958, and a second terminal of current source 958 is coupled to a second power supply terminal, e.g., ground. A drain electrode of transistors 964 is coupled to a drain electrode of transistor 960 and gate electrodes of transistors 968 and 970. A gate electrode of transistor 960 and a gate electrode of transistor 962 is coupled to receive a first bias voltage. A drain electrode of transistor 966 is coupled to a drain electrode of transistor 962. A drain electrode of transistor 968 is coupled to a source electrode of transistor 964. A drain electrode of transistor 970 is coupled to a source electrode of transistor 966. Source electrodes of transistors 968 and 970 are coupled to the second power supply terminal. Configuration units 952 are similar to configuration units 104 in structure but are of p-type transistors. The configuration units include switches to the drain electrodes of the input transistors, but share a common source electrode coupled to the first power supply terminal and a common gate electrode coupled to receive a bias voltage. As yet another configurability embodiment of the folded cascade opamp, the configuration units are applied to the p-type transistor current source location instead of the input n-type transistors, as in opamp 900, to manipulate that portion of the offset contribution. Method 500 will manipulate the p-type transistors of configuration units 952 to minimize their own offset contribution as well as that of input transistors 945 and 956.

By now it should be appreciated that there has been provided an opamp system which allows for post-manufacture configuration of transistors which form the group A and B transistors of the opamp. A calibration process can be performed to determine a configuration of the transistors in groups A and B that achieves a more balanced opamp and thus reduces the input referred offset. Also, a gain modifier can be applied to the output of the opamp, and the calibration process can further take into account a gain modification by the gain modifier to reduce the input referred offset.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. For example, the calibration process can be performed on any number, N, of transistors having $2^n$ possible combinations from which to choose a balanced grouping. Configuration groups 104, 902, and 952 are only examples, and in some embodiments, configuration groups can be applied concurrently to any matched pairs throughout the opamp to achieve a higher accuracy at the expense of more permutations. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a semiconductor device includes an operational transconductance amplifier (OTA) including: a matched pair of transistors including a first transistor and a second transistor; configuration units, each of the configuration units including a first set of switches, a second set of switches, and an input transistor; gain adjustment circuitry coupled to adjust gain of the OTA; measurement circuitry coupled to measure offset in the OTA; control logic configured to: operate the first and second sets of switches to couple input transistors of a first group of the configuration units to the first transistor of the matched pair of transistors, and to couple input transistors of a remaining group of the configuration units to the second transistor of the matched pair of transistors; wherein settings of the first and second sets of switches are selected to minimize the offset. In one aspect, the semiconductor device further includes the first set of switches of the configuration units include: a first switch and a second switch, wherein the first switch includes a first terminal coupled to an internal voltage node and a second terminal coupled to a first current electrode of the input transistor; the second switch includes a first terminal coupled to a gate electrode of the input transistor and a second terminal coupled to a plus voltage node. In a further aspect, the second set of switches of the configuration units include: a third switch and a fourth switch, wherein the third switch includes a first terminal coupled to an output voltage node and a second terminal coupled to the first current electrode of the input transistor; the fourth switch includes a first terminal coupled to the gate electrode of the input transistor and a second terminal coupled to a minus voltage node. In another aspect, the matched pair of transistors are configured as a current mirror, wherein the first transistor includes a first current electrode coupled to a supply voltage, a second current electrode coupled to an internal voltage node, and a gate electrode coupled to the second current electrode and a gate electrode of the second transistor; and the second transistor includes a first current electrode coupled to the supply voltage and a second current electrode coupled to an output voltage node. In another aspect, the matched pair of transistors are configured in a folded cascode OTA. In another aspect, the gain adjustment circuitry includes: an operational amplifier having a non-negating input coupled to a reference voltage and a negating input coupled to an output of the operational amplifier; a resistor ladder having one end terminal coupled to the output of the operational amplifier, a plurality of resistors coupled in series, and switched taps between each of the resistors, wherein the switched taps are coupled to an output of the OTA. In yet another aspect, the measurement circuitry includes: a resistor ladder including a plurality of resistors coupled in series between a supply voltage and ground; a first comparator including: a first input coupled to an output of the OTA and an output of the gain adjustment circuitry in a calibration mode, and a second input coupled between a pair of the resistors in the resistor ladder; a second comparator including: a first input coupled to both the output of the OTA and the output of the gain adjustment circuitry in the calibration mode, and a second input coupled between another pair of the resistors in the resistor ladder. In a further aspect, an output of the first comparator provides an upper limit of output voltage of the OTA for the control logic; and an output of the second comparator provides a lower limit of the output voltage of the OTA for the control logic. In another aspect, during a calibration mode, first and second inputs to the OTA are shorted together, or set to a respective first and second reference voltage. In another aspect, during a calibration mode, the control logic varies the configuration units included in the first and remaining groups to determine an optimum combination of the configuration units in the first and remaining groups that minimizes the offset, wherein variation in performance of the input transistors in the configuration units is due to process variations.

In another embodiment, an operational transconductance amplifier (OTA) includes configuration circuits, each of the configuration circuits including an input transistor; a first transistor including a gate electrode, a first current electrode coupled to a supply voltage, a second current electrode coupled to a current source via a first subset of the configuration circuits and to the gate electrode; a second transistor including a first current electrode coupled to the supply voltage, a second current electrode coupled to the current source via a second subset of the configuration circuits, and a gate electrode coupled to the gate electrode of the first transistor; control logic configured to calibrate the OTA by testing various subsets of the configuration circuits to determine which of the configuration circuits to include in each of the first and second subsets to minimize offset in the OTA, wherein the input transistors of a first of the various subsets are coupled to the first transistor during the testing and the input transistors of a second of the various subsets are coupled to the second transistor during the testing. In one aspect, the OTA further includes a gain adjustment circuit coupled to adjust output of the OTA during a calibration mode. In another aspect, the OTA further includes a measurement circuit coupled to the output of the OTA and the gain adjustment circuit during the calibration mode, the measurement circuit configured to provide indicators of whether adjusted output of the OTA is less than an upper limit and greater than a lower limit. In another aspect, the OTA further includes a first set of switches in each of the configuration units that include: a first switch and a second switch, wherein the first switch includes a first terminal coupled to an internal voltage node and a second terminal coupled to a first current electrode of the input transistor; the second switch includes a first terminal coupled to a gate electrode of the input transistor and a second terminal coupled to a plus voltage node. In a further aspect, a second set of switches in each of the configuration units that include: a third switch and a fourth switch, wherein the third switch includes a first terminal coupled to an output voltage node and a second terminal coupled to the first current electrode of the input transistor; the fourth switch includes a first terminal coupled to the gate electrode of the input transistor and a second terminal coupled to a minus voltage node. In yet a further aspect, the control logic is further configured to: operate the first and second sets of switches to couple input transistors of the first subset of the configuration units to the first transistor, and to couple input transistors of the second subset of the configuration units to the second transistor.

In yet another embodiment, a method of calibrating an operational transconductance amplifier (OTA) includes coupling a first subset of configuration units to a first transistor of a matched pair of transistors in the OTA; coupling a second subset of configuration units to a second transistor of the matched pair of transistors in the OTA; providing indicators of whether an output of the OTA is less than an upper limit and greater than a lower limit; if the output of the OTA is greater than the upper limit or less than the lower limit, exchanging one or more of the configuration units in the first subset of configuration units with one or more of the configuration units in the second subset of configuration units and determining whether the output of the OTA is between the upper limit and the lower limit. In one aspect, the method further includes connecting inputs to the OTA to each other. In another aspect, the method further includes varying a gain of the OTA if the output of the OTA is between the upper limit and the lower limit; determining whether the output of the OTA is between the upper limit and the lower limit after the gain is varied. In another aspect, a number of configuration units in the first subset is equal to a number of configuration units in the second subset.

What is claimed is:

1. A semiconductor device comprising:
an operational amplifier including:
  a matched pair of transistors including a first transistor and a second transistor;
  configuration units, each of the configuration units including a first set of switches, a second set of switches, and an input transistor;
gain adjustment circuitry coupled to adjust gain of the operational amplifier;
measurement circuitry coupled to measure offset in the operational amplifier;
control logic configured to:
  operate the first and second sets of switches to couple input transistors of a first group of the configuration units to the first transistor of the matched pair of transistors, and to couple input transistors of a remaining group of the configuration units to the second transistor of the matched pair of transistors;
  wherein settings of the first and second sets of switches are selected to minimize the offset.

2. The semiconductor device of claim 1 further comprising:
the first set of switches of the configuration units include:
  a first switch and a second switch, wherein
    the first switch includes a first terminal coupled to an internal voltage node and a second terminal coupled to a first current electrode of the input transistor;
    the second switch includes a first terminal coupled to a gate electrode of the input transistor and a second terminal coupled to a plus voltage node.

3. The semiconductor device of claim 2 wherein:
the second set of switches of the configuration units include:
  a third switch and a fourth switch, wherein
    the third switch includes a first terminal coupled to an output voltage node and a second terminal coupled to the first current electrode of the input transistor;
    the fourth switch includes a first terminal coupled to the gate electrode of the input transistor and a second terminal coupled to a minus voltage node.

4. The semiconductor device of claim 1 wherein:
the matched pair of transistors are configured as a current mirror, wherein
  the first transistor includes a first current electrode coupled to a supply voltage, a second current electrode coupled to an internal voltage node, and a gate electrode coupled to the second current electrode and a gate electrode of the second transistor; and
  the second transistor includes a first current electrode coupled to the supply voltage and a second current electrode coupled to an output voltage node.

5. The semiconductor device of claim 1 wherein:
the matched pair of transistors are configured in a folded cascode operational amplifier.

6. The semiconductor device of claim 1 wherein:
the gain adjustment circuitry includes:
  an operational amplifier having a non-negating input coupled to a reference voltage and a negating input coupled to an output of the operational amplifier;
  a resistor ladder having one end terminal coupled to the output of the operational amplifier, a plurality of resistors coupled in series, and switched taps between each of the resistors, wherein the switched taps are coupled to an output of the operational amplifier.

7. The semiconductor device of claim 1 wherein:
the measurement circuitry includes:
  a resistor ladder including a plurality of resistors coupled in series between a supply voltage and ground;
  a first comparator including: a first input coupled to an output of the operational amplifier and an output of the gain adjustment circuitry in a calibration mode, and a second input coupled between a pair of the resistors in the resistor ladder;
  a second comparator including: a first input coupled to both the output of the operational amplifier and the output of the gain adjustment circuitry in the calibration mode, and a second input coupled between another pair of the resistors in the resistor ladder.

8. The semiconductor device of claim 7 wherein:
an output of the first comparator provides an upper limit of output voltage of the operational amplifier for the control logic; and
an output of the second comparator provides a lower limit of the output voltage of the operational amplifier for the control logic.

9. The semiconductor device of claim 1 wherein:
during a calibration mode, first and second inputs to the operational amplifier are shorted together, or set to a respective first and second reference voltage.

10. The semiconductor device of claim 1 wherein:
during a calibration mode, the control logic varies the configuration units included in the first and remaining groups to determine an optimum combination of the configuration units in the first and remaining groups that minimizes the offset, wherein variation in performance of the input transistors in the configuration units is due to process variations.

11. An operational dance amplifier comprising:
configuration circuits, each of the configuration circuits including an input transistor;
a first transistor including a gate electrode, a first current electrode coupled to a supply voltage, a second current electrode coupled to a current source via a first subset of the configuration circuits and to the gate electrode;
a second transistor including a first current electrode coupled to the supply voltage, a second current electrode coupled to the current source via a second subset of the configuration circuits, and a gate electrode coupled to the gate electrode of the first transistor;
a gain adjustment circuit coupled to adjust an output of the operational amplifier during a calibration mode; and
control logic configured to calibrate the operational amplifier by testing various subsets of the configuration circuits to determine which of the configuration circuits to include in each of the first and second subsets to minimize offset in the operational amplifier, wherein the input transistors of a first of the various subsets are coupled to the first transistor during the testing and the input transistors of a second of the various subsets are coupled to the second transistor during the testing.

12. The operational amplifier of claim 11 further comprising:
a measurement circuit coupled to the output of the operational amplifier and the gain adjustment circuit during the calibration mode, the measurement circuit configured to provide indicators of whether adjusted output of the operational amplifier is less than an upper limit and greater than a lower limit.

13. The operational amplifier of claim 11 further comprising:
a first set of switches in each of the configuration units that include:
 a first switch and a second switch, wherein
  the first switch includes a first terminal coupled to an internal voltage node and a second terminal coupled to a first current electrode of the input transistor;
  the second switch includes a first terminal coupled to a gate electrode of the input transistor and a second terminal coupled to a plus voltage node.

14. The operational amplifier of claim 13 wherein:
a second set of switches in each of the configuration units that include:
 a third switch and a fourth switch, wherein
  the third switch includes a first terminal coupled to an output voltage node and a second terminal coupled to the first current electrode of the input transistor;
  the fourth switch includes a first terminal coupled to the gate electrode of the input transistor and a second terminal coupled to a minus voltage node.

15. The operational amplifier of claim 14 wherein the control logic is further configured to:
operate the first and second sets of switches to couple input transistors of the first subset of the configuration units to the first transistor, and to couple input transistors of the second subset of the configuration units to the second transistor.

16. A method of calibrating an operational amplifier comprising:
coupling a first subset of configuration units to a first transistor of a matched pair of transistors in the operational amplifier;
coupling a second subset of configuration units to a second transistor of the matched pair of transistors in the operational amplifier;
adjusting, by a gain adjustment circuit, an output of the operational amplifier during a calibration mode; and
providing indicators of whether an output of the operational amplifier is less than an upper limit and greater than a lower limit;
if the output of the operational amplifier is greater than the upper limit or less than the lower limit,
 exchanging one or more of the configuration units in the first subset of configuration units with one or more of the configuration units in the second subset of configuration units and determining whether the output of the operational amplifier is between the upper limit and the lower limit.

17. The method of claim 16 further comprising:
connecting inputs to the operational amplifier to each other.

18. The method of claim 16 further comprising:
varying a gain of the operational amplifier if the output of the operational amplifier is between the upper limit and the lower limit;
determining whether the output of the operational amplifier is between the upper limit and the lower limit after the gain is varied.

19. The method of claim 16 wherein a number of configuration units in the first subset is equal to a number of configuration units in the second subset.

* * * * *